(12) United States Patent
Kususe et al.

(10) Patent No.: US 8,981,420 B2
(45) Date of Patent: Mar. 17, 2015

(54) NITRIDE SEMICONDUCTOR DEVICE

(75) Inventors: Takeshi Kususe, Anan (JP); Yoshiyuki Aihara, Anan (JP); Daisuke Sanga, Anan (JP); Kouichiroh Deguchi, Anan (JP)

(73) Assignee: Nichia Corporation, Anan-Shi (JP)

( * ) Notice: Subject to any disclaimer, the term of this patent is extended or adjusted under 35 U.S.C. 154(b) by 708 days.

(21) Appl. No.: 11/436,026

(22) Filed: May 18, 2006

(65) Prior Publication Data
US 2006/0261355 A1 Nov. 23, 2006

(30) Foreign Application Priority Data

May 19, 2005 (JP) ................. P 2005-146952

(51) Int. Cl.
H01L 33/00 (2010.01)
H01L 33/42 (2010.01)
H01L 33/40 (2010.01)
H01L 33/32 (2010.01)

(52) U.S. Cl.
CPC ............ *H01L 33/42* (2013.01); *H01L 33/40* (2013.01); *H01L 33/32* (2013.01)
USPC ...... 257/100; 257/94; 257/103; 257/E33.062; 257/E33.065; 257/E33.069; 257/E33.074; 313/499; 313/500; 313/510

(58) Field of Classification Search
USPC ............ 257/79, 94–103, E33.062–E33.065, 257/E33.069, E33.074; 313/499–510
See application file for complete search history.

(56) References Cited

U.S. PATENT DOCUMENTS

| | | |
|---|---|---|
| 5,990,500 A | 11/1999 | Okazaki et al. |
| 6,452,214 B2 | 9/2002 | Kaneyama et al. |
| 6,921,928 B2 | 7/2005 | Sonobe et al. |
| 6,924,515 B2 | 8/2005 | Senda et al. |
| 6,936,859 B1 | 8/2005 | Uemura et al. |
| 7,005,664 B2 | 2/2006 | Mitchell et al. |
| 7,042,012 B2 | 5/2006 | Senda et al. |
| 2002/0014632 A1 | 2/2002 | Kaneyama et al. |
| 2002/0036286 A1 | 3/2002 | Ho et al. |
| 2003/0222270 A1 | 12/2003 | Uemura |
| 2003/0227065 A1 | 12/2003 | Senda et al. |

(Continued)

FOREIGN PATENT DOCUMENTS

| | | |
|---|---|---|
| JP | 8-250540 A | 9/1996 |
| JP | 10-229219 A | 8/1998 |

(Continued)

OTHER PUBLICATIONS

Zhang et al., "Indium tin oxide films prepared by radio frequency magnetron sputtering method at a low processing temperature", Thin Solid Films, vol. 376, Nos. 1-2, pp. 255-263, Elsevier-Sequoia S.A., Lausanne, Switzerland, Nov. 1, 2000.

(Continued)

*Primary Examiner* — Meiya Li
(74) *Attorney, Agent, or Firm* — Birch, Stewart, Kolasch & Birch, LLP

(57) ABSTRACT

A nitride semiconductor device includes a conductive oxide film with high reliability is provided. The nitride semiconductor device having a nitride semiconductor layer includes a conductive oxide film on the nitride semiconductor layer and a pad electrode on the conductive oxide film. The pad electrode includes a junction layer that contains a first metal and is in contact with the conductive oxide film, and a pad layer that contains a second metal.

24 Claims, 4 Drawing Sheets

(56) References Cited

U.S. PATENT DOCUMENTS

| | | |
|---|---|---|
| 2004/0026701 A1 | 2/2004 | Murai et al. |
| 2004/0051107 A1* | 3/2004 | Nagahama et al. ............. 257/79 |
| 2004/0140474 A1 | 7/2004 | Ueda et al. |
| 2004/0149999 A1 | 8/2004 | Uemura et al. |
| 2004/0164310 A1 | 8/2004 | Uemura |
| 2004/0195579 A1 | 10/2004 | Sonobe |
| 2004/0222524 A1* | 11/2004 | Song et al. ................... 257/744 |
| 2005/0067623 A1* | 3/2005 | Ha et al. ......................... 257/79 |
| 2005/0104077 A1 | 5/2005 | Song et al. |
| 2005/0104080 A1* | 5/2005 | Ichihara et al. ................ 257/98 |
| 2005/0189558 A1* | 9/2005 | Liu ............................... 257/100 |
| 2005/0247949 A1 | 11/2005 | Senda et al. |
| 2006/0226417 A1* | 10/2006 | Lee et al. ........................ 257/21 |
| 2006/0273324 A1 | 12/2006 | Asai et al. |

FOREIGN PATENT DOCUMENTS

| | | | |
|---|---|---|---|
| JP | 10-256602 A | 9/1998 |
| JP | 10-308533 A | 11/1998 |
| JP | 11-8410 A | 1/1999 |
| JP | 11-220168 A | 8/1999 |
| JP | 11-274562 A | 10/1999 |
| JP | 2000-36619 A | 2/2000 |
| JP | 2000-164928 A | 6/2000 |
| JP | 2000-183400 A | 6/2000 |
| JP | 2000-244012 A | 9/2000 |
| JP | 2000-286447 A | 10/2000 |
| JP | 2001-44503 A | 2/2001 |
| JP | 2001-044503 A | 2/2001 |
| JP | 2001-102673 A | 4/2001 |
| JP | 2001-196633 A | 7/2001 |
| JP | 2002-151737 A | 5/2002 |
| JP | 2002-368271 A | 12/2002 |
| JP | 2003-77862 A | 3/2003 |
| JP | 2003-101071 A | 4/2003 |
| JP | 2003-347584 A | 12/2003 |
| JP | 2004-6498 A | 1/2004 |
| JP | 2004-6991 A | 1/2004 |
| JP | 2004-14725 A | 1/2004 |
| JP | 2004-88083 A | 3/2004 |
| JP | 2004-111623 A | 4/2004 |
| JP | 2004-139747 A | 5/2004 |
| JP | 2004-172568 A | 6/2004 |
| JP | 2004-319671 A | 11/2004 |
| JP | 2004-319672 A | 11/2004 |
| JP | 2004-363621 A | 12/2004 |
| JP | 2005-11857 A | 1/2005 |
| JP | 2005-011857 A | 1/2005 |
| JP | 2005- 45038 A | 2/2005 |
| JP | 2005-109284 A | 4/2005 |
| JP | 2005-123489 A | 5/2005 |
| JP | 2005-150741 A | 6/2005 |
| JP | 2005-158904 A | 6/2005 |
| JP | 2005-302804 A | 10/2005 |
| JP | 3736181 B2 | 11/2005 |
| JP | 2006-5378 A | 1/2006 |
| WO | WO 01/86731 A | 11/2001 |
| WO | WO-01/86731 A1 | 11/2001 |

OTHER PUBLICATIONS

European Search Report Issued on Dec. 8, 2010 in counterpart European Application 06010373.8.

Zhang et al., "Indium tin oxide films prepared by radio frequency magnetron sputtering method at a low processing temperature", Thin Solid Films vol. 376, No. 1-2, Nov. 1, 2000, pp. 255-263, XP004237486.

* cited by examiner

NITRIDE SEMICONDUCTOR DEVICE

BACKGROUND OF THE INVENTION

1. Field of the Invention

The present invention relates to a nitride semiconductor device employing a nitride semiconductor.

2. Description of the Related Art

Nitride semiconductors have been used for light emitting devices such as light emitting diode (LED) and laser diode (LD), light receiving devices such as solar batteries and optical sensors, and electronic devices such as transistors and power devices. Especially, light emitting diodes utilizing a nitride semiconductor have been widely used in a traffic signal, a large-scale display, and a back light source etc.

A nitride semiconductor light emitting device employing a nitride semiconductor basically has a structure where a p-type semiconductor layer and an n-type semiconductor layer are stacked on a substrate and electrodes are disposed respectively to electrically connect to the p-type semiconductor layer and the n-type semiconductor layer. Also, there has been a known structure for the electrode which is electrically connected to the p-type semiconductor layer, in which an electrode made of a transparent material is disposed on the entire surface of the p-type semiconductor layer and a pad electrode made of a metal is disposed thereon. A full-surface electrode made of a transparent material on the p-type semiconductor layer is provided to diffuse the electric current injected from the pad-electrode into the semiconductor, and to transmit and extract light that is emitted from the nitride semiconductor light emitting device.

A metal thin film and a conductive oxide film such as ITO, ZnO, $In_2O_3$, and $SnO_2$ used as such full-surface electrode on the p-type semiconductor layer are described in, for example, Japanese Unexamined Patent Application Publication No. 2001-196633.

When a conductive oxide film is used as the full-surface electrode, a pad electrode is provided to connect the full-surface electrode with an external circuit. Rh, Pt, and W are cited as a metallic material having good adhesion with the conductive oxide film, and the pad electrode has been formed by using such metals.

However, in the pad electrode disposed on the conductive oxide film as described in Japanese Unexamined Patent Application Publication No. 2001-196633, adhesion strength with the conductive oxide film is not enough for providing adequate reliability.

For this reason, in the structure disclosed in Japanese Unexamined Patent Application No. 2005-11857, an opening is formed in the ITO portion so as to connect the p-side pad electrode and the p-type nitride semiconductor directly through the opening. With this structure, adhesion with the pad electrode may be improved, however, supply of electric current to the nitride semiconductor layer is not uniform enough. In addition, when the material for the pad electrode is simply selected in view of the adhesion between the conductive oxide film and the pad electrode, there has been a problem that sufficient flow of current between them can be hardly obtained.

SUMMARY OF THE INVENTION

An object of the present invention is therefore, to provide a nitride semiconductor device provided with a conductive oxide film and has high reliability.

In order to achieve the object described above, a nitride semiconductor device of the invention includes a nitride semiconductor layer and comprises a conductive oxide film and a pad electrode on the nitride semiconductor layer in sequence.

The pad electrode comprises a junction layer being in contact with the conductive oxide film and including a first metal, and a pad layer including a second metal that is different from the first metal.

The nitride semiconductor device of the invention that has a structure as described above contains the junction layer containing a first metal and in contact with the conductive oxide film and a pad layer containing a second metal. Therefore, adhesion between the pad electrode and the conductive oxide film can be improved.

DETAILED DESCRIPTION OF THE PREFERRED EMBODIMENTS

In the following, preferred embodiments of the invention are described in reference to the accompanying drawings. Herein, the modes described below illustrate a nitride semiconductor device embodying the technical idea of the invention and the nitride semiconductor device of the invention is not limited to the modes described below. In addition, some of the sizes and positional relationships of the members shown in the respective drawings are exaggerated in order to clarify the description.

Embodiment 1

Figure 1:
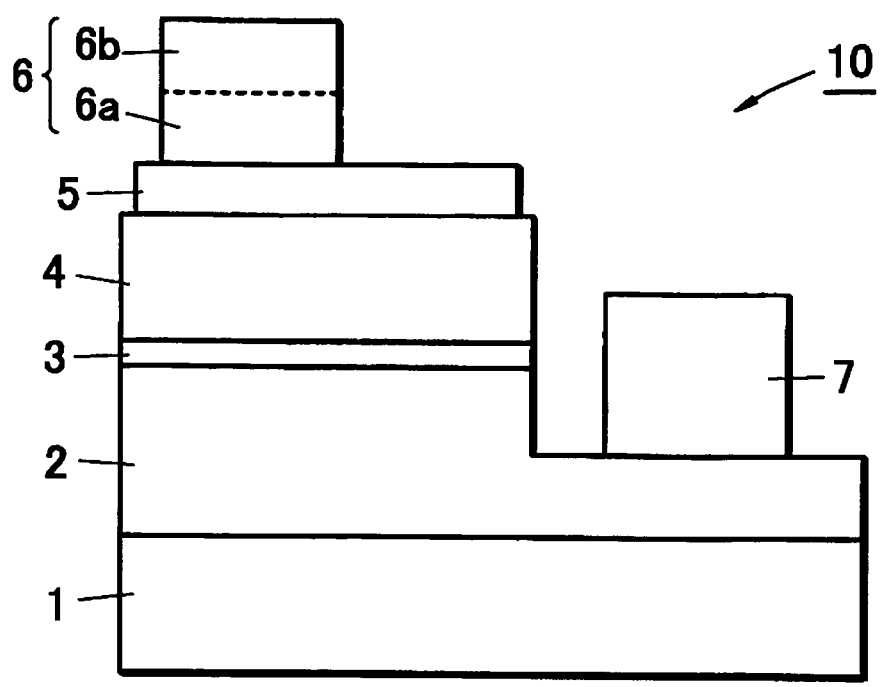
FIG. 1 is a schematic cross-sectional view showing a structure of a nitride semiconductor device according to a first embodiment of the invention.

FIG. 1 is a cross-sectional view showing a nitride semiconductor light emitting device 10 according to Embodiment 1 of the invention. As shown in FIG. 1, the nitride semiconductor light emitting device according to Embodiment 1 comprises an n-type nitride semiconductor layer 2 stacked on a substrate 1 via an optional single layer or a multi-layer such as a buffer layer (not shown), an active layer 3 stacked on the n-type nitride semiconductor layer 2, and a p-type semiconductor layer 3 stacked on the active layer 3. The n-type nitride semiconductor layer 2 and the p-type nitride semiconductor layer 3 are provided with respective electrodes connected thereto.

In Embodiment 1, the electrode disposed on the p-type nitride semiconductor layer 4 comprises, for example, a conductive oxide film 5 which is electrically connected to the nitride semiconductor and a pad electrode 6 on the conductive oxide film 5. The pad electrode 6 is an electrode for connecting to an external circuit. When face-up mounting is employed (in which light is mainly extracted from the semiconductor layer side), the pad electrode is connected to an external circuit by wire bonding and the like. When flip-chip mounting in which light is mainly extracted from the substrate side is employed, the pad electrode is connected to an external circuit via an eutectic layer (bump: Ag, Au, Sn, In, Bi, Cu, Zn etc.).

In the nitride semiconductor light emitting device 10 of Embodiment 1, the pad electrode 6 includes a junction layer 6a containing a first metal and the full surface on the side facing the nitride semiconductor layer is in contact with the conductive oxide film 5. Here, the junction layer 6a is in contact with the conductive oxide film 5 with the first metal film made of the first metal included therein.

In Embodiment 1, the film thickness of the first metal film is smaller than the average plane roughness Ra of the surface of the conductive oxide film. With this arrangement, the semiconductor device capable of injecting electric current in the entire surface of the nitride semiconductor layer, and having excellent adhesion between the conductive oxide film and the pad electrode can be obtained.

In the present Embodiment 1, the thickness of the first metal film is in a range of 5 to 30 Å and the conductive oxide film is made of ITO. With this arrangement, the semiconductor device capable of injecting electric current in the entire surface of the nitride semiconductor layer, and with excellent adhesion between the conductive oxide film and the pad electrode can be obtained. Further, by forming the conductive oxide film with ITO, the electric current can be injected to the entire surface of the nitride semiconductor layer more uniformly and the electric current can flow effectively to the semiconductor device. Especially, in the nitride semiconductor light emitting device, the light extracting efficiency can be further improved. In addition, it is preferable that when the first metal film is disposed approximately evenly on the conductive oxide film 5 with a thickness described above, the adhesion between the conductive oxide film and the pad electrode can be further improved.

In the present embodiment, good adhesion is obtained by arranging the average surface roughness Ra of the conductive oxide film surface larger than the thickness of the first metal film. This is believed as below. The first metal film is located on the surface of the conductive oxide film. Since the average surface roughness Ra of the conductive oxide film is larger than the thickness of the first metal film, the first metal film is located on an irregular surface of the conductive oxide film having the average surface roughness of Ra.

Figure 2:
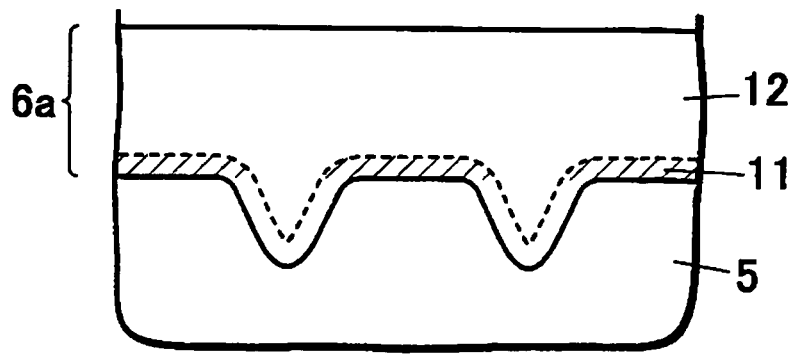
FIG. 2 is a schematic partially sectional view showing a preferable configuration of a first metal film in a nitride semiconductor device according to the first embodiment of the invention.

As shown in FIG. 2, the first metal located in a region which is a recess portion of the irregular surface of the conductive oxide film is surrounded by an oxide film and the first metal in this portion is easily oxidized. Thus, it is believed that a part of the first metal has been oxidized. On the other hand, it is believed that in the regions other than the recess portions such as the protrusion portion of the conductive oxide film, the first metal is not easily oxidized than the first metal in the recess portions. Therefore, the electrons and the holes can move effectively as in the conventional junction between the metal layer and the conductive oxide film.

That is, it is believed that the first metal included in the junction layer binds with oxygen that is included in the conductive oxide film at the oxidized region of the recess and strengthens the junction between the conductive oxide film and the pad electrode. In addition, in the region other than the recess portion, electrons and holes can move efficiently between the pad electrode and the conductive oxide film, so that the semiconductor device having excellent adhesion and light extracting efficiency can be obtained.

Figure 3:
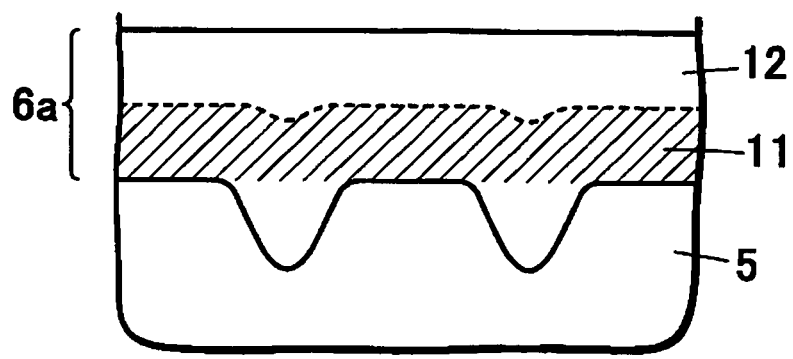
FIG. 3 is a schematic partially sectional view showing another configuration of a first metal film in a nitride semiconductor device according to the first embodiment of the invention.

For example, as shown in FIG. 3, it is believed that when the thickness of the first metal film is larger than the average surface roughness Ra of the conductive oxide film surface, good adhesion can be obtained in the oxidized portion. However, the un-oxidized portions of the first metal may join in a lateral direction resulting in a plate-like structure that is easily peeled off.

On the other hand, as shown in FIG. 2, when the thickness of the first metal film 11 is smaller than the average surface roughness Ra of the conductive oxide film 5, the top surface of the first metal film 11 on the recesses of the conductive oxide film 5 locates lower than the surface of the protrusions of the conductive oxide film 5.

It is believed that in such condition, the portions of the first metal film that have not been oxidized do not merge into a tabular form so that the first metal film 11 has the oxidized regions having good adhesion scattered therein, thereby total adhesion of the first metal film 11 can be improved, and at the same time, because of the un-oxidized parts in the first metal film 11, the contact resistance with the conductive oxide film can also be reduced.

In the invention, the average surface roughness Ra of the conductive oxide film can be measured by using the Scanning Probe Microscope (SPI3800N, manufactured by SII Nano Technology Inc.)

In addition, when the surface to be measured (hereinafter referred to as "measuring plane") is observed from a side-sectional view, the average surface roughness of the conductive oxide film Ra can be obtained according to the definition of arithmetical mean deviation of profile in JIS B0601.

In accordance with JIS B0601, the mean line (waviness profile) is obtained from the primary profile of the measuring plane, and the mean line is subtracted from the primary profile. That is, the mean line is substituted into a straight line to obtain the roughness profile. Then, according to the coordination system defined by JIS B0601, the direction corresponding to the substituted straight line of the mean line is designated as X-axis and the direction perpendicular to the X-axis and in parallel with the cross section is designated as Z-axis.

When a sampling length of l is extracted from the roughness profile in the direction of the X-axis, the mean line corresponding to the extracted portion can be represented by the formula (1).

$$Z_0 = \frac{1}{l}\int_0^l Z(x)dx \tag{1}$$

In this case, the average surface roughness Ra is an average value of the absolute values of deviation between $Z(x)$ and $Z_0$, and can be calculated using the formula (2).

$$Ra = \frac{1}{l} \int_0^l |Z(x) - Z_0| dx \quad (2)$$

Specifically, the measuring plane is observed at its cross-section as described above with a high-powered microscope such as TEM to obtain the mean line and the roughness profile from the profile curve. A 500 nm region is selected arbitrarily on X-axis and 100 points of X-values ($X_1$ to $X_{100}$) are taken within the range at a regular interval, then, the Z-values ($Z(x_1)$ to $Z(x_{100})$) corresponding to each X-value are measured.

The average value $Z_0$ can be obtained by the formula (3) using the measured Z-values.

$$Z_0 = (1/100) \times \{Z(x_1) + Z(x_2) + (x_3) + \ldots + Z(x_{100})\} \quad (3)$$

The average surface roughness Ra can be obtained from the formula (4) by using $Z_0$.

$$Ra = (1/100) \times \{|Z(x_1) - Z_0| + |Z(x_2) - Z_0| + \ldots + |Z(x_{100}) - Z_0|\} \quad (4)$$

In the present invention, it is preferable that the first metal is at least one selected from the group consisting of Titanium (Ti), Zirconium (Zr), and Hafnium (Hf) When the first metal for the p-side pad electrode is selected from such metals, the adhesion with the conductive oxide film can be improved and the contact resistance can be reduced. In addition, in the n-side pad electrode, good adhesion with the nitride semiconductor layer can be obtained and the contact resistance can be reduced. Especially, Ti is preferably used.

In the pad electrode 6, the layer 6b (hereinafter referred to as "pad layer 6b") located above the junction layer 6a contains a second metal that is different from the first metal. The pad layer 6b may contain the first metal in a fewer amount than the junction layer 6a, or may not contain the first metal.

Besides the first metal layer 11, the junction layer 6a may include an additional layer such as a current diffusion layer 12 between the first metal layer 11 and the pad layer 12. The component of the current diffusion layer 12 may differ from that of the first metal film 11 and the pad layer 12. The component of the current diffusion layer may also be the same as the pad layer 12, when the current diffusion layer is separated from the pad layer 12 by an intermediate layer (not shown) as described later in Example 1. However, the current diffusion layer is preferably made of a material that is less easily oxidized than the first metal. Examples of the material for the current diffusion layer contains at least one selected from the group of W, Mo, Cd, Ni, Cu, Ag, Rh, Au, Pt, and Pd. With this arrangement, formation of an oxide on the current diffusion layer can be prevented and the electric current can be diffused in the junction layer.

As described above, an intermediate layer 17 made of a third metal, which is different from the first metal and the second metal, may be disposed between the junction layer 6a and the pad layer 6b. The third metal that forms the intermediate layer 17 may be selected in accordance with the aim such as to improve the adhesion between the junction layer 6a and the pad layer 6b, or to prevent the diffusion of metal material in the junction layer 6a and/or the pad layer 6b.

In the nitride semiconductor light emitting device 10 of Embodiment 1, a conductive wire or an eutectic layer may be connected directly to the pad layer 6b, or a layer such as Au layer for connecting to a conductive wire or an eutectic layer may be further provided on the pad layer 6b. It is preferable that by providing Au as described above, good connection can be obtained with a conductive wire or a eutectic layer whose main component is Au.

The second metal that is contained in the pad layer preferably has a higher reflectivity than that in the first metal at the main wavelength of the light emitted from the nitride semiconductor light emitting device. With this arrangement, light traveling in the pad electrode can be reflected and the light extracting efficiency can be improved.

When the pad layer 6b contains multiple metals, it is preferable to place metals with higher reflectivity in the part close to the junction layer 6a. With this arrangement, light incident on the pad electrode can be reflected more efficiently.

When the second metal has a high reflectivity, it is preferable that the junction layer is in contact with the pad layer. With this arrangement, light entering the pad electrode can be reflected more efficiently.

It is preferable that the second metal is at least one type of element having high reflectivity selected from the group consisting of rhodium (Rh), aluminum (Al), silver (Ag), and platinum (Pt). When such metals are used as the second metal, absorption of light within the pad electrode can be prevented and light can be extracted efficiently. Especially, Rh is preferable in view of prevention of migration etc. The current diffusion layer described above may contain the second metal. With the construction described above, the light can be extracted more efficiently.

When a conductive wire or an eutectic layer is directly connected to the pad layer 6b as described above, the thickness of the pad layer 6b is required to be 3000 Å or more. In a case where a layer is further provided over the pad layer 6b in order to connect the pad layer 6b with a conductive wire such as Au and a eutectic layer, when the pad layer 6b is made of a metal with a high reflectivity as listed above, a layer thickness of 200 Å or more is sufficient to reflect light.

Examples of methods for disposing the pad electrode of Embodiment 1 having construction described above include a sputtering method. In Embodiment 1, for example, when disposing the junction layer 6a by using a sputtering method, firstly, the first metal is used as the target and then the target is switched to the second metal.

The pad electrode 6 on the conductive oxide film 5 may be disposed to substantially entire surface of the conductive oxide film 5, but it is preferable that a part of the conductive film 5 is exposed. The shape of the pad electrode 6 is not specifically limited and various shapes such as a circle and a polygon such as a triangle and a rectangle can be employed. The size of the pad electrode 6 is not specifically limited, as long as the electric current can be supplied efficiently to the conductive oxide layer 5 and the p-type nitride semiconductor layer.

When the pad electrode 6b is made of a material that easily absorbs light, it is preferable to set the size of the pad electrode 6b so that the absorption of light from the active layer can be minimized and light can be extracted effectively.

In the nitride semiconductor light emitting device, in general, the p-type semiconductor layer and the active layer and a part of the n-type nitride semiconductor layer are removed along the depth direction from a region of the nitride semiconductor light emitting device, and a surface of the n-type nitride semiconductor layer is exposed. Then, the n-side pad electrode is disposed on the exposed surface of the n-type nitride semiconductor layer (that is, the p-side pad electrode and the n-side pad electrode are located on the same side).

However, in the present invention, the n-side pad electrode may be disposed on the surface of the n-type nitride semiconductor layer that is opposite from the surface where the conductive oxide film 5 is disposed. Especially, when the nitride semiconductor light emitting device is formed on a conductive substrate such as a nitride semiconductor substrate, generally, the conductive substrate and the n-type nitride semiconductor layer are electrically connected, so that the n-side pad electrode is electrically connected to the n-type nitride semiconductor layer via a conductive substrate etc.

In addition, it is preferable to use a similar material for the n-side pad electrode as the material used for the p-side pad electrode 6 described above (hereinafter, the pad electrode on the above described conductive oxide film is referred to as "p-side pad electrode"). The first metal in the p-side pad electrode 6 listed above has good adhesion with the n-type nitride semiconductor layer and has a low contact resistance. Therefore, when the material for the n-side pad electrode is of the same kind and the same thickness as the material for the p-side pad electrode, the adhesion between the n-side pad electrode and the n-type nitride semiconductor layer can also be improved and the contact resistance between the n-side pad electrode and the n-type nitride semiconductor layer can also be reduced.

When the p-side pad electrode 6 and the n-side pad electrode are formed with the same material, the thickness of the p-side pad electrode 6 is preferably larger than the thickness of the n-side pad electrode. This is believed that the volume of the junction layer 6a in the p-side pad electrode increases due to oxidation of a part of the first metal, in which oxygen is taken from the conductive oxide film to the part of the first metal. Consequently, a larger amount of the oxide of the first metal is included in the p-type pad electrode. Therefore, the adhesion with the conductive oxide film can be improved, and when the p-side pad electrode 6 has a pad layer 6b that reflects light, the light extracting efficiency of the n-side pad electrode can be improved.

Further, in the structure where the p-side pad electrode and the n-side pad electrode are located on the same side, when the p-side pad electrode 6 and the n-side pad electrode are made of the same material, the p-side pad electrode and the n-side pad electrode can be formed in the same process. As described above, when the p-side pad electrode and the n-side pad electrode are formed in the same manufacturing process, the manufacturing process can be simplified and the nitride semiconductor light emitting device with high reliability can be obtained at a low price.

In an example of the methods for forming the p-side pad electrode and the n-side pad electrode in the same process using the same material, a mask with predetermined pattern is disposed by way of resist on the conductive oxide film and the n-type nitride semiconductor layer, then, the junction layer 6a and the pad layer 6b are stacked thereon in sequence by using, for example, a sputtering machine.

The conductive oxide film 5 preferably contains at least one element selected from the group consisting of zinc (Zn), Indium (In), tin (Sn), and magnesium (Mg). Specific example thereof includes ZnO, $In_2O_3$, $SnO_2$, and ITO (a complex oxide of In and Sn). Among them, ITO can be used preferably because ITO has a high optical transparency in the optical wavelengths (in visible region) and has a high conductivity.

It is preferable that the conductive oxide film 5 has a density that is lower in the portion near the interface with the nitride semiconductor layer than in the portion near the upper surface thereof. For example, the conductive oxide film 5 preferably has a porous part only in the portion near the interface with the semiconductor layer. "Porous state" in the present specification means a state in which a large number of pores of, for example, from about 20 nm to about 200 nm in diameter exist either uniformly or nonuniformly.

The upper surface side of the conductive oxide film is preferably formed as a transparent film with good crystallinity. Also, in the conductive oxide film 5, a region which has a low density and is located in the semiconductor side may be a film that is partially noncrystalline (amorphous), but it is preferable that the film is transparent or substantially transparent.

The extent of a low density region is preferably controlled in a range of 10 to 50% of the entire thickness of the conductive oxide film, in the direction from the interface with the p-type nitride semiconductor layer. As described above, by forming only the side near the p-type nitride semiconductor layer with a low density, the contact resistance with the p-type nitride semiconductor layer can be reduced and at the same time, the transparency can be improved. Accordingly, the surface side of the conductive oxide layer has a higher density so that a good adhesion can be obtained between the conductive oxide film and the junction layer in the pad electrode.

The total thickness of the conductive oxide film 5 is not specifically limited, and for example, the thickness is set from about 100 nm to about 1000 nm. The region with a low density may be set from about 10 nm to about 500 nm.

In addition, it is preferable that the conductive oxide film 5 not only not absorb visible light, but, for example, also light generated from an active layer due to the gallium nitride type compound semiconductor described above, i.e., light having a wavelength in the vicinity of 360 nm to 650 nm, preferably 380 nm to 560 nm and 400 nm to 600 nm. It is also preferable that the conductive oxide film have good efficiency, e.g., can transmit with a transmissivity of 90% or greater, 85% or greater, or 80% or greater. In this way, the conductive oxide film can be used as an electrode of a nitride semiconductor light emitting device having a desired wavelength.

The conductive oxide film 5 can be formed using a known method in the art. Various methods can be employed. For example, a sputtering method, a reactive sputtering method, a vacuum evaporation method, an ion beam assist deposition method, an ion plating method, a laser ablation method, a CVD method, a spray method, a spin coat method, and a dip method and a combination of such a method and thermal treatment can be employed.

Specific examples include a method for forming a conductive oxide film such as ITO film, in which an ITO film is formed by a sputtering machine using a target for an ITO film formation. Specific examples also include a method for forming a film by way of vacuum evaporation at room temperature or a high temperature.

In addition, after forming a conductive oxide film such as an ITO film, a thermal treatment may be carried out. Examples of the thermal treatment include a lamp anneal treatment and an anneal treatment using a furnace. After forming an ITO film, a treatment may be carried out by using laser ablation. Such methods may be used in combination arbitrarily.

Examples of the methods for forming a conductive oxide film in which the density varies along the thickness direction include sputtering methods. In a method, a sputtering gas is changed from a gas of low or zero partial pressure of oxygen to a gas of high partial pressure of oxygen, or the partial pressure of oxygen is gradually increased when forming the conductive oxide film such as an ITO film. In another method, besides the target for forming an ITO film, a target with rich in In or a target with less oxygen is used and then the target for forming an ITO film is stopped. In another method, the loading voltage to the sputtering machine is gradually or rapidly increased during the formation of the film. Examples of methods for forming a conductive oxide film such as an ITO film by using vacuum deposition include a method in which the temperature of the semiconductor layer is gradually or rapidly increased or decreased, a method in which the deposition rate is rapidly decreased, and a method in which oxygen ion is radiated by using an ion gun in process of film formation.

In another method, after forming the conductive oxide film such as an ITO film, annealing is carried out in a reduced gas atmosphere (carbon monoxide, hydrogen, argon or a mixture of two or more thereof) at, for example, from about 200° C. to about 650° C. for predetermined time according to the film thickness. Also, a multiple thermal treatments may be carried out in which partial forming of the conductive oxide film such as an ITO film and consecutive thermal treatment are carried out repeatedly. Examples of the thermal treatment include a lamp anneal treatment and an anneal treatment using a furnace. A treatment after forming an ITO film may be carried out by using electron beam irradiation or laser ablation. Such methods may be used in combination arbitrarily.

A known insulating substrate or conductive substrate can be used for forming the nitride semiconductor light emitting device of the invention. Examples of such substrates include sapphire, spinel, SiC, a nitride semiconductor such as GaN, and GaAs. The insulating substrate may eventually be removed or may not be removed. When the insulating substrate is not removed in the manufacturing process, in general, both the p-electrode and the n-electrode are disposed on the same surface side of the semiconductor layer. When the insulating substrate is eventually removed or the conductive substrate is used, as described above, both the p-electrode and the n-electrode may be disposed on the same surface side of the nitride semiconductor layer, or may be disposed on the different surface sides respectively.

The material for the n-type and p-type nitride semiconductor layers and the active layer are not specifically limited, and a gallium nitride system compound semiconductor such as $In_XAl_YGa_{1-X-Y}N$ ($0 \leq X$, $0 \leq Y$, $X+Y \leq 1$) may preferably be used. These nitride semiconductor layers may have a single-layer structure, a stacked-layer structure with the layers of different composition and different thickness, or a super-lattice structure. Especially, the active layer preferably has a single quantum well structure or a multi quantum well structure, made of stacked thin layers in which the quantum effect occurs. The active layer is omissible.

In general, such nitride semiconductor layer may be fabricated as a homo-structure or a hetero-structure including MIS junction, PIN junction or PN junction. The nitride semiconductor layer can be fabricated by using a known method such as a Metalorganic Vapor Phase Epitaxy (MOVPE) growth method, a Metalorganic Chemical Vapour Deposition (MOCVD) growth method, a Hydride Vapor Phase Epitaxy (HVPE) growth method, and a Molecular Beam Epitaxial (MBE) growth method. The thickness of the nitride semiconductor layer is not specifically limited and the nitride semiconductor layer of various thickness can be employed.

An example of stacked structure of the nitride semiconductor layers comprises a buffer layer made of AlGaN, an undoped GaN layer, an n-type contact layer made of Si doped N-type GaN, a superlattice layer in which GaN layer and InGaN layer are alternatively stacked, an active layer in which GaN layer and InGaN layer are alternatively stacked, a superlattice layer in which Mg doped AlGaN layer and Mg doped InGaN layer are alternatively stacked, and a p-side contact layer made of Mg doped GaN.

Embodiment 2

Figure 4:
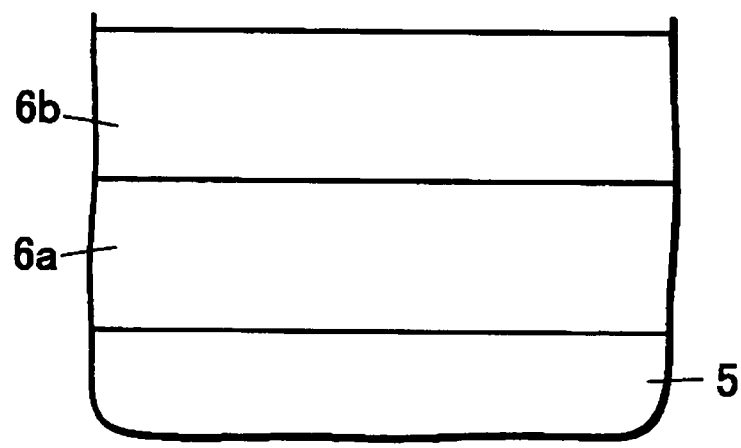
FIG. 4 is a schematic partially sectional view showing a structure of a nitride semiconductor light emitting device according to a second embodiment of the invention.

FIG. 4 is a partially sectional view showing a nitride semiconductor light emitting device according to Embodiment 2 of the invention. The structure is formed in the same manner as in the first embodiment, except for the parts described below.

In Embodiment 2, an alloy layer made of an alloy of the first metal and the second metal is included in the junction layer 6a of the pad electrode 6 as the layer in contact with the conductive oxide film. With this, the adhesion between the pad electrode 6 and the conductive oxide film 5 can be improved. Also, when the junction layer comprises the alloy of the first metal and the second metal, the adhesion can be improved by using a minimum amount of the materials. When the second metal has a high reflectivity, the light extracting efficiency of the pad electrode can be improved.

When the second metal has a higher reflectivity than that of the first metal at the main wavelength of the nitride semiconductor light emitting device, by increasing the ratio of the second metal in the alloy, the reflectivity and the light extracting efficiency can be improved.

As described in Embodiment 2, when the junction layer is made of an alloy of the first metal and the second metal, the thickness of the junction layer can be set in a range of 50 to 10000 Å and with this range of the thickness, the adhesion can be improved sufficiently. Therefore, according to the structure of Embodiment 2, the thickness of the film made of the first metal does not need to be relatively thin as required in Example 1, so that the process yield can be increased.

In the pad electrode 6 of Embodiment 2, when the pad layer made of the second metal having a high reflectivity at the main wavelength of the nitride semiconductor light emitting device is provided on the junction layer 6a, for example, it is preferable that a good adhesion of the pad electrode can be obtained and the light extracting efficiency can be improved when the thickness of the junction layer is from 50 to 200 Å.

The ratio of the first metal in the alloy of the first metal and the second metal in the junction layer 6a of the second embodiment is preferably from 10 to 40 wt %. When the ratio of the first metal is 10 wt % or less, the contact resistance with the nitride semiconductor increases and when the ratio of the first metal is 40 wt % or greater, the reflectivity decreases. When the ratio of the first metal is from 10 to 40 wt %, in the p-side pad electrode, good adhesion with the conductive oxide film can be obtained and the contact resistance can be reduced. In addition, in the n-side pad electrode, good adhesion with the nitride semiconductor layer can be obtained and the contact resistance can be reduced. Moreover, it is further preferable when the ratio of the first metal is from 15 to 30 wt %.

It is also preferable in Embodiment 2 that the recesses and the protrusions are provided on the surface of the conductive oxide film 5. When the surface thereof has such irregularity, especially in the recess parts, an oxide of the first metal is tend to be formed near the interface between the junction layer 6a and the conductive oxide film, so that the adhesion can be further improved.

Examples of the methods for forming the junction layer 6a made of such alloy include a method in which the film is formed by way of sputtering method, using an alloy of the first metal and the second metal as the target. Examples of the alloys made of the first metal and the second metal and used as the target include a sintered body made of the first metal and the second metal.

In Embodiment 2, when the same material is used for the p-side pad electrode 6 and the n-side pad electrode, it is preferable that the thickness of the p-side pad electrode is larger than the thickness of the n-side pad electrode. With this arrangement, the adhesion between the p-side pad electrode and the conductive oxide film can be improved and the light extracting efficiency at the n-side pad electrode can be improved.

Figure 5:
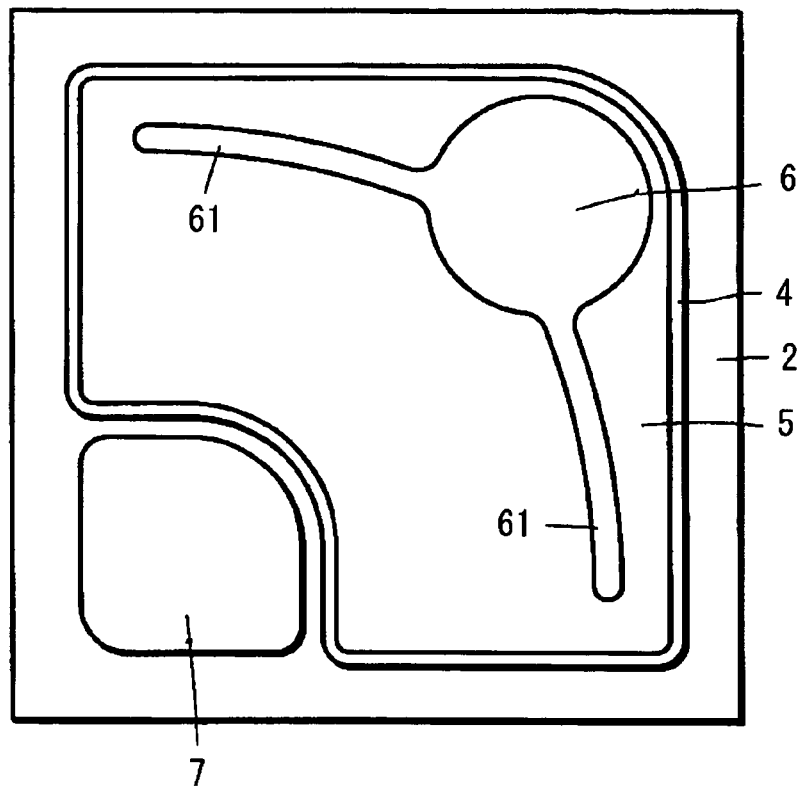
FIG. 5 is a schematic plan view showing a preferable shape of a p-side pad-electrode in a nitride semiconductor light emitting device according to the first and the second embodiments of the invention.

In addition, in the nitride semiconductor light emitting device of Embodiments 1 and 2 of the invention, the p-side pad electrode preferably has an extended conductive portion such as the portion 61 shown in FIG. 5. When the pad electrode 6 has such an extended conductive portion depicted as the reference number 61, it is possible to make the entire active layer emits light efficiently, and it is especially effective when the p-side pad electrode side of the plane is made as the light extracting surface in the nitride semiconductor light emitting device of the present invention. In addition, since the extended conductive portion has the junction layer and the pad layer described above, good adhesion with the conductive oxide film can be obtained and the contact resistance can be reduced. Further, when the second metal has a high reflectivity, the light extracting efficiency can be improved.

In FIG. 5, the reference number 2 depicts the n-type semiconductor layer, the reference number 4 depicts the p-type nitride semiconductor layer, and the reference number 7 depicts the n-side pad electrode.

Especially, as shown in FIG. 5, when the p-side pad electrode and the n-side pad electrode are disposed on the same surface side of the nitride semiconductor layer, generally, the n-side pad electrode 7 is disposed adjacent to at least one side of the nitride semiconductor light emitting device. For example, as shown in FIG. 5, it is preferable that the n-side pad electrode is disposed at a corner adjacent to two sides of the nitride semiconductor element and the p-side pad electrode is disposed at the opposing corner from the corner adjacent to the n-side pad electrode 7.

In addition, the extended portion 61 of the p-side pad electrode 6 extends along the adjacent sides of the corner where the pad portion is located. With this configuration, light can be emitted efficiently from the active layer located between the p-side pad electrode 6 and the n-side pad electrode. Moreover, by disposing the extended conductive portion 61 connecting to the p-side pad electrode 6 to electrically connect onto the conductive oxide film 5, the electric current can be diffused to the entire p-type nitride semiconductor layer efficiently, so that light can be emitted efficiently from the entire active layer. Further, emission of light with high luminance can be obtained from the periphery of the p-side pad electrode 6 and the extended conductive portion 61.

Embodiments 1 and 2 above are described with the example of the case where the conductive oxide film and the p-pad electrode are formed on the p-type nitride semiconductor layer. However, other constructions can also be employed in the present invention. For example, a nitride semiconductor light emitting device having the conductive oxide film and the n-side pad electrode on the n-type nitride semiconductor layer may obtain a similar effect.

EXAMPLES

Example 1

The nitride semiconductor light emitting device of Example 1 will now be described with reference to FIG. 1. The nitride semiconductor light emitting device 10 includes a buffer layer made of AlGaN (not shown) on a sapphire substrate 1 and an undoped GaN layer (not shown) on the buffer layer, and a n-type nitride semiconductor layer 2, an active layer 3, and a p-type nitride semiconductor layer 4 are stacked in order thereon. The n-type nitride semiconductor layer 2 comprises an n-type contact layer made of Si-doped GaN layer and an n-type cladding layer having a superlattice structure where GaN layers and InGaN layers are alternately stacked. The active layer 3 has a multiquantum well structure comprising alternately stacked layers of a first barrier layer made of undoped GaN, a well layer made of InGaN, and a second barrier layer made of undoped GaN. The p-type nitride semiconductor layer 4 comprises a p-type cladding layer which has a super lattice structure where Mg-doped AlGaN layers and Mg-doped InGaN layers are alternately stacked, and a p-type contact layer made of Mg-doped GaN stacked thereon.

In a region of the n-type nitride semiconductor layer 2, a part of the active layer 3 and the p-type nitride semiconductor layer 4 stacked on the n-type nitride semiconductor layer are removed, and a part of the n-type nitride semiconductor layer is removed in the thickness direction to form an exposed area. Then, an n-pad electrode 7 is disposed on the exposed area of the n-type nitride semiconductor layer 2.

On almost entire surface of the p-type nitride semiconductor layer 3, a conductive oxide film 5 made of ITO is disposed and a pad electrode 6 is disposed on a part of the conductive oxide film 5.

The nitride semiconductor light emitting device of Example 1 is fabricated according to the manufacturing method below.

<Formation of Semiconductor Layers>

A wafer is formed by stacking a buffer layer $Al_{0.1}Ga_{0.9}N$ of 100 Å in thickness, an undoped GaN layer of 1.5 μm in thickness, an n-type nitride semiconductor layer 2, an active layer 3, and a p-type nitride semiconductor layer 4 in order on a sapphire substrate 1 of 2 inches in diameter, by using a MOVPE reactor. The n-type nitride semiconductor layer 2 is formed with an n-type contact layer made of Si doped GaN of 2.165 μm in thickness, and an n-type cladding layer of 640 Å in thickness wherein GaN layer (40 Å) and InGaN layer (20 Å) are alternately stacked ten times. The active layer is formed with a multiquantum well structure (total thickness of 1930 Å) comprising a barrier layer made of undoped GaN with 250 Å in thickness, and a well layer made of $In_{0.3}Ga_{0.7}N$ with 30 Å in thickness, a first barrier layer of $In_{0.02}Ga_{0.98}N$ with 100 Å in thickness and a second barrier layer of undoped GaN with 150 Å in thickness which are alternately stacked for six times. The p-type nitride semiconductor layer 4 comprises a p-type cladding layer comprising a Mg-doped AlGaN layer (40 Å) and a Mg-doped InGaN layer (20 Å) alternately stacked in order for 10 times and a p-type contact layer made of Mg-doped GaN of 0.2 μm in thickness and a p-type contact layer made of Mg-doped GaN of 0.5 μm in thickness stacked in order.

<Etching>

The obtained wafer is annealed in a nitrogen atmosphere at 600° C. in a reaction vessel so as to further reduce the resistance of the p-type cladding layer and the p-type contact layer.

After annealing, the wafer is removed from the reaction vessel and a mask is disposed with a predetermined pattern on the top surface of the p-type contact layer. Then, etching is carried out through the mask by using an etching machine to expose a part of the n-type contact layer.

<Formation of ITO Film>

After the mask is removed, the wafer is set in a sputtering machine and an oxide target made of a sintered body of $In_2O_3$ and $SnO_2$ is placed in the sputtering machine. Then, using the sputtering machine, a conductive oxide film 5, an ITO film having an average surface roughness Ra of 40 Å is disposed to a thickness of 4000 Å on the almost entire surface of the p-type contact layer 8 of the wafer.

<Formation of Pad Electrode 6>

On the conductive oxide film 5, a mask with a predetermined pattern is formed by way of resist and 15 Å of Ti, 100 Å of Rh, 100 Å of Au, 2000 Å of Rh, and 5000 Å of Au are disposed thereon in sequence, and then by way of lift-off, a pad electrode 6 is formed. Then, an n-side pad electrode 7 made of W/Pt/Au is disposed with a thickness of 6000 Å on the n-type contact layer.

Next, a thermal treatment is carried out at 300° C. or above in an annealing apparatus.

The wafer thus obtained is divided at predetermined places to obtain the nitride semiconductor light emitting elements 10.

That is, in the nitride semiconductor light emitting device of Example 1, the junction layer 6a comprises a first metal film 11 made of Ta film with 15 Å in thickness and a current diffusion film 12 made of Rh film with 100 Å in thickness, and the pad layer 6b made of Rh layer with 2000 Å in thickness is disposed via an intermediate layer made of Au with 100 Å in thickness.

The nitride semiconductor light emitting device of Example 1 thus fabricated has an improved adhesion and reduced contact resistance between the conductive oxide film and the pad electrode. Moreover, the light extracting efficiency is improved.

Example 2

The nitride semiconductor light emitting device of Example 2 is fabricated in the same manner as in Example 1 except the pad electrode 6 is formed as described below.

<Formation of Pad Electrode 6>

On the conductive oxide film 5, a mask having a predetermined pattern is disposed by way of resist. Ti is disposed thereon with a thickness of 15 Å as the junction layer 6a and Rh is disposed thereon with a thickness of 2000 Å as the pad electrode 6b. By disposing to cover the entire surface of the Ti film, the Rh film also functions as a current diffusion layer. Au of 5000 Å in thickness is further disposed thereon and by carrying out lift-off, the pad electrode 6 is formed. Then, an n-side pad electrode 7 made of W/Pt/Au is disposed with a thickness of 6000 Å on the n-type contact layer.

Next, a thermal treatment is carried out at 300° C. or above in an annealing apparatus.

The wafer thus obtained is divided at predetermined places to obtain the nitride semiconductor light emitting elements 10.

In the nitride semiconductor light emitting device of Example 2, the reflectivity at the p-pad electrode can be further improved and moreover, the light extracting efficiency can be further improved than that in the nitride semiconductor light emitting device of Example 1.

Comparative Example 1

As a Comparative Example 1, a nitride semiconductor light emitting device was fabricated in the same manner as in Example 2, except that the p-side pad electrode was made of Rh/Pt/Au, and the n-side pad electrode was made of W/Pt/Au. The results show that the nitride semiconductor light emitting device of Example 2 is 1.4 times superior in the adhesion between the conductive oxide film and the p-side pad electrode than that of the nitride semiconductor light emitting device of Comparative Example 1.

Comparative Example 2

Further, as Comparative Example 2, the nitride semiconductor light emitting device was fabricated in a same manner as in Example 2, except that the thickness of Ti in the pad electrode 6 was 30 Å. The comparison result of adhesion between the conductive oxide film and the p-side pad electrode with the device of Comparative Example 1 whose p-side pad electrode is Rh/Pt/Au and the n-side pad electrode is W/Pt/Au shows approximately the same.

Comparative Example 3

Further, as Comparative Example 3, a fabrication was attempted in a same manner as in Example 2, except that the Ti layer in the p-side pad electrode was 300 Å. However, the pad electrode was exfoliated from the conductive oxide film and the nitride semiconductor light emitting device was not obtained.

Example 3

Figure 6:
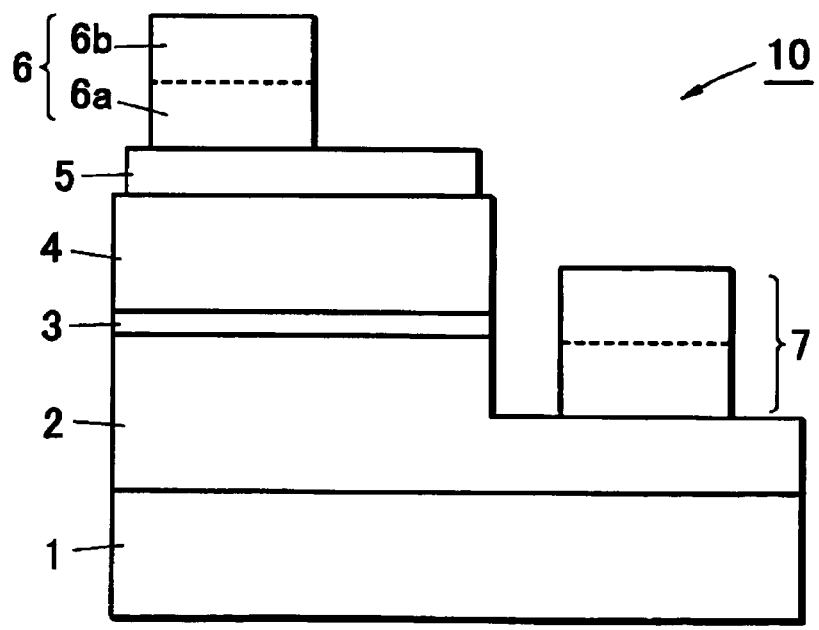
FIG. 6 is a schematic cross-sectional view showing a construction of a nitride semiconductor light emitting device according to a fourth and a seventh examples of the invention.
Figure 7:
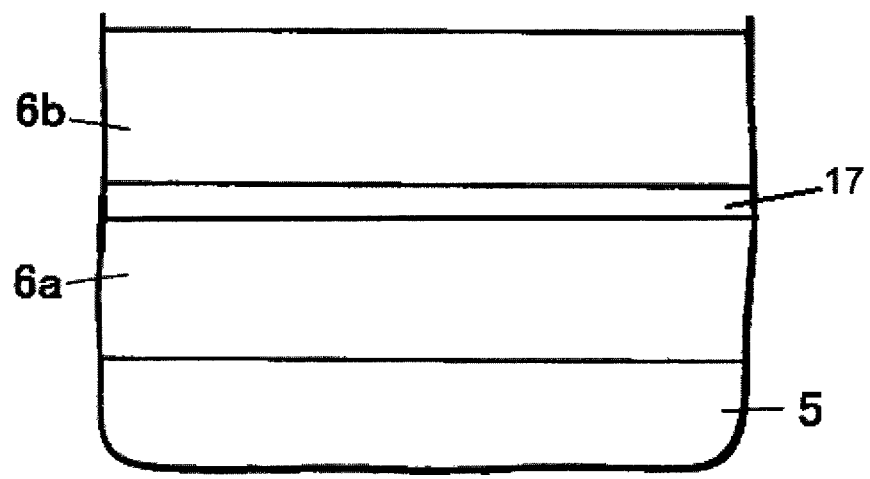
FIG. 7 is a schematic partially sectional view showing a structure of a nitride semiconductor light emitting device having an intermediate layer, according to a third embodiment of the invention.

As shown in FIG. 6, the nitride semiconductor light emitting device of Example 3 is fabricated in a same manner as in Example 2, except that the n-side pad electrode 7 is made by the same material as the p-side pad electrode 6 and the thickness of the junction layer 6a in the p-side pad electrode 6 is larger than the thickness of the junction layer in the n-side pad electrode 7.

In the nitride semiconductor light emitting device of Example 3, in addition to the advantageous effect of Example 2, the reflectivity at the n-side pad electrode can be improved, and the light extracting efficiency can be further improved. In addition, compared to the case in which the junction layer of the p-side pad electrode and the junction layer of the p-side electrode are made with the same thickness, the reflectivity at the n-side pad electrode can be improved while maintaining good adhesion, and further, the light extracting efficiency of the nitride semiconductor light emitting device can be improved.

Example 4

As shown in FIG. 6, the nitride semiconductor light emitting device of Example 4 was fabricated in a same manner as in Example 2, except that n-side pad electrode was formed with the same material as the p-side pad electrode in the same manufacturing process.

In Example 4, the p-side and the n-side pad electrodes may be formed as shown below.

On the conductive oxide film 5, a mask having a predetermined pattern is formed by way of resist. Ti is disposed thereon with a thickness of 15 Å as the junction layer 6a and Rh is disposed thereon with a thickness of 2000 Å as the pad electrode 6b. Further, Au is disposed to a thickness of 5000 Å and by using a lift-off method, the p-side pad electrode 6 and the n-side pad electrode 7 are formed.

Next, a thermal treatment is carried out at 300° C. or above in an annealing apparatus.

The wafer thus obtained is divided at predetermined places to obtain the nitride semiconductor light emitting elements 10 of Example 4.

In the nitride semiconductor light emitting device thus obtained, the reflectivity at the p-pad electrode can be further improved and moreover, the light extracting efficiency can be further improved and the manufacturing process can be simplified compared with the nitride semiconductor light emitting device of Example 2.

Example 5

The nitride semiconductor light emitting devise according to Example 5 relates to Embodiment 2 of the present invention, shown in FIG. 4. That is, the nitride semiconductor light emitting device of Example 5 has a similar structure as the nitride semiconductor light emitting device of Example 2, except that the metallic material of the junction layer in the p-side pad electrode 6 differs.

Specifically, in the nitride semiconductor light emitting device of Example 5, the junction layer of the p-side pad electrode 6 is made of an alloy of Ti and Rh.

The p-side pad electrode 6 in the nitride semiconductor light emitting device of Example 5 is fabricated according to the production processes shown below.

First, after forming the conductive oxide film 5 made of ITO, a mask having a predetermined pattern is disposed on the conductive oxide film 5 by way of resist. Next, a target made of an alloy of Ti and Rh is set in a sputtering machine and the alloy made of Ti and Rh is stacked to a thickness of 50 Å, by using the sputtering machine. Then, using Rh and Au as the targets, Rh of 1000 Å in thickness and Au of 5000 Å thickness are respectively stacked in order by sputtering. Then, the p-side pad electrode 6 is formed by way of lift-off.

In the present example, the ratio of Ti in the alloy of Ti and Rh is about 25 wt %.

In the nitride semiconductor light emitting device of Example 5, the reflectivity at the p-pad electrode can be further improved and moreover, the light extracting efficiency can be further improved than that in the nitride semiconductor light emitting device of Example 1.

Comparative Example 4

As a Comparative Example 4, a nitride semiconductor light emitting device was fabricated in the same manner as in Example 5, except that the p-side pad electrode was made of Rh/Pt/Au, and the n-side pad electrode was made of W/Pt/Au. The results show that the nitride semiconductor light emitting device of Example 5 is 1.4 times superior in the adhesion between the conductive oxide film and the p-side pad electrode than that of the nitride semiconductor light emitting device of Comparative Example 1.

The nitride semiconductor light emitting device of Example 5 also showed a good light extracting efficiency in the pad-electrode.

Example 6

The nitride semiconductor light emitting device of Example 6 is fabricated in a same manner as in Example 5, except that the n-side pad electrode 7 is made with the same material as the p-side pad electrode 6 and the thickness of the junction layer 6a in the p-side pad electrode 6 is larger than the thickness of the junction layer in the n-side pad electrode 7.

In the nitride semiconductor light emitting device of Example 6, in addition to the advantageous effect of Example 5, the reflectivity at the n-side pad electrode can be improved, and the light extracting efficiency can be further improved. In addition, compared to the case in which the junction layer of the p-side pad electrode and the junction layer of the p-side electrode are made with the same thickness, the reflectivity at the n-side pad electrode can be improved while maintaining good adhesion, and further, the light extracting efficiency of the nitride semiconductor light emitting device can be improved.

Example 7

The nitride semiconductor light emitting device of Example 7 was fabricated in a same manner as in Example 5, except that n-side pad electrode was formed with the same material as the p-side pad electrode in the same manufacturing process.

That is, in the nitride semiconductor light emitting device of Example 7, the junction layer 6a of the p-side pad electrode 6 was made of an alloy of Ti and Rh. Accordingly, the part in the n-side pad electrode contacting with the n-type nitride semiconductor layer was made of an alloy of Ti and Rh.

In Example 7, the p-side and the n-side pad electrodes of the nitride semiconductor light emitting device were formed as shown below.

First, after forming the conductive oxide film made of ITO, a mask having a predetermined pattern was disposed by way of resist on the conductive oxide film and the surface of the n-type nitride semiconductor layer that was exposed by etching. Next, a target made of an alloy of Ti and Rh was set in the sputtering machine and the alloy made of Ti and Rh was stacked by using the sputtering machine. Then, using Rh and Au as the respective targets, Rh and Au were stacked in order by sputtering. Then, the p-side pad electrode 6 and the n-side pad electrode 7 were formed by way of lift-off.

In the nitride semiconductor light emitting device of Example 7, the reflectivity at the n-side pad electrode can be further improved and moreover, the light extracting efficiency can be further improved and the manufacturing process can be simplified compared with the nitride semiconductor light emitting device of Example 5.

INDUSTRIAL APPLICABILITY

The nitride semiconductor device of the present invention can be used to advantage for semiconductor light emitting devices that constitute various kinds of light source, such as backlight source, displays, illumination, automotive lamps, and so forth, and in semiconductor light receiving devices and other semiconductor devices.

We claim:
1. A nitride semiconductor light emitting device comprising:
   a substrate,
   an n-type nitride semiconductor layer formed on the substrate,
   an active layer formed on the n-type nitride semiconductor layer,
   a p-type nitride semiconductor layer on the active layer,
   a conductive oxide film on the p-type nitride semiconductor layer; and
   a p-side pad electrode on the conductive oxide film,
   wherein:
   the p-side pad electrode comprises a junction layer and a pad layer,
   the junction layer comprises a first metal film, said first metal film being made of a first metal,
   the first metal film is located directly on the conductive oxide film,
   the pad layer comprises a second metal which is different from the first metal,
   a surface of the conductive oxide film in contact with the first metal film is an irregular surface,
   the first metal film has a thickness smaller than an average surface roughness Ra of the irregular surface, and
   the first metal film that contacts said irregular surface of the conductive oxide film has:
   one portion of the first metal film that is located in a recess of the irregular surface of the conductive oxide film, said one portion of the first metal film being oxidized, and another portion of the first metal film that is located on a protrusion of the irregular surface of the conductive oxide film, said another portion of the first metal film not being oxidized.

2. The nitride semiconductor light emitting device according to claim 1, wherein said junction layer includes a current diffusion layer on said first metal film.

3. The nitride semiconductor light emitting device according to claim 2, wherein an intermediate layer made of a third metal, which is different from the first metal and the second metal, is disposed between said junction layer and said pad layer.

4. The nitride semiconductor light emitting device according to claim 2, wherein said current diffusion layer contains the second metal.

5. The nitride semiconductor light emitting device according to claim 1, wherein said conductive oxide film contains at least one element selected from the group consisting of zinc, indium, tin, and magnesium.

6. The nitride semiconductor light emitting device according to claim 1, wherein said conductive oxide film is made of indium tin oxide (ITO).

7. The nitride semiconductor light emitting device according to claim 1, wherein a part of the first metal contained in said junction layer is oxidized.

8. The nitride semiconductor light emitting device according to claim 1,
wherein an n-side pad electrode is formed on said n-type nitride semiconductor layer, and
wherein said n-side pad electrode and said p-side pad electrode are made of similar materials.

9. The nitride semiconductor light emitting device according to claim 8, wherein the p-side pad electrode and the n-side pad electrode are formed with the same material, and the thickness of the p-side pad electrode is larger than the thickness of the n-side pad electrode.

10. The nitride semiconductor light emitting device according to claim 1, wherein the first metal is selected from the group consisting of Ti, Zr, and Hf.

11. The nitride semiconductor light emitting device according to claim 1, wherein the second metal has a higher reflectance than the first metal with respect to a light emitted from the active layer.

12. The nitride semiconductor light emitting device according to claim 1, wherein the second metal is selected from the group consisting of Rh, Al, Ag, and Pt.

13. The nitride semiconductor light emitting device according to claim 1, wherein the total thickness of the conductive oxide film is from 100 nm to 1000 nm.

14. A nitride semiconductor light emitting device comprising:
a substrate,
an n-type nitride semiconductor layer formed on the substrate,
an active layer formed on the n-type nitride semiconductor layer,
a p-type nitride semiconductor layer on the active layer,
a conductive oxide film made of ITO on the p-type nitride semiconductor layer; and
a p-side pad electrode on the conductive oxide film, wherein:

the p-side pad electrode comprises a junction layer and a pad layer,
the junction layer comprises a first metal film, said first metal film being made of a first metal,
the first metal film is located directly on the conductive oxide film,
the pad layer comprises a second metal which is different from the first metal,
a surface of the conductive oxide film in contact with the first metal film is an irregular surface,
the first metal film has a thickness in a range of 5 Å and to 30 Å and less than an average surface roughness Ra of the irregular surface, and
the first metal film that contacts said irregular surface of the conductive oxide film has:
one portion of the first metal film that is located in a recess of the irregular surface of the conductive oxide film, said one portion of the first metal film being oxidized, and
another portion of the first metal film that is located on a protrusion of the irregular surface of the conductive oxide film, said another portion of the first metal film not being oxidized.

15. The nitride semiconductor light emitting device according to claim 14, wherein said junction layer includes a current diffusion layer on said first metal film.

16. The nitride semiconductor light emitting device according to claim 15, wherein an intermediate layer made of a third metal, which is different from the first metal and the second metal, is disposed between said junction layer and said pad layer.

17. The nitride semiconductor light emitting device according to claim 15, wherein said current diffusion layer contains the second metal.

18. The nitride semiconductor light emitting device according to claim 14, wherein a part of the first metal contained in said junction layer is oxidized.

19. The nitride semiconductor light emitting device according to claim 14,
wherein an n-side pad electrode is formed on said n-type nitride semiconductor layer, and
wherein said n-side pad electrode and said p-side pad electrode are made of similar materials.

20. The nitride semiconductor light emitting device according to claim 19, wherein the p-side pad electrode and the n-side pad electrode are formed with the same material, and the thickness of the p-side pad electrode is larger than the thickness of the n-side pad electrode.

21. The nitride semiconductor light emitting device according to claim 14, wherein the first metal is selected from the group consisting of Ti, Zr, and Hf.

22. The nitride semiconductor light emitting device according to claim 14, wherein the second metal has a higher reflectance than the first metal with respect to a light emitted from the active layer.

23. The nitride semiconductor light emitting device according to claim 14, wherein the second metal is selected from the group consisting of Rh, Al, Ag, and Pt.

24. The nitride semiconductor light emitting device according to claim 14, wherein the total thickness of the conductive oxide film is from 100 nm to 1000 nm.

* * * * *